US007661040B2

(12) United States Patent
Beaujoin et al.

(10) Patent No.: US 7,661,040 B2
(45) Date of Patent: Feb. 9, 2010

(54) METHOD OF TESTING A SEQUENTIAL ACCESS MEMORY PLANE AND A CORRESPONDING SEQUENTIAL ACCESS MEMORY SEMICONDUCTOR DEVICE

(75) Inventors: Marc Beaujoin, Grenoble (FR); Thomas Alofs, Grenoble (FR); Paul Armagnat, Seyssinet (FR)

(73) Assignee: STMicroelectronics S.A., Montrouge (FR)

( * ) Notice: Subject to any disclaimer, the term of this patent is extended or adjusted under 35 U.S.C. 154(b) by 1631 days.

(21) Appl. No.: 10/075,113

(22) Filed: Feb. 13, 2002

(65) Prior Publication Data

US 2002/0138797 A1  Sep. 26, 2002

(30) Foreign Application Priority Data

Feb. 21, 2001 (FR) .................................. 01 02333

(51) Int. Cl.
*G11C 29/00* (2006.01)
*G01R 31/28* (2006.01)
(52) U.S. Cl. ..................... 714/718; 714/719; 714/720; 714/726; 714/732; 714/733; 714/736
(58) Field of Classification Search ......... 714/718–720, 714/724–739, 54
See application file for complete search history.

(56) References Cited

U.S. PATENT DOCUMENTS

| 5,379,410 | A | | 1/1995 | Okada | 395/575 |
| 5,579,322 | A | | 11/1996 | Onodera | 371/22.3 |
| 5,751,727 | A | * | 5/1998 | Martens | 714/718 |
| 6,108,802 | A | * | 8/2000 | Kim et al. | 714/718 |
| 6,330,696 | B1 | * | 12/2001 | Zorian et al. | 714/720 |
| 6,571,364 | B1 | * | 5/2003 | Maeno et al. | 714/736 |
| 6,751,757 | B2 | * | 6/2004 | Biskup et al. | 714/54 |

FOREIGN PATENT DOCUMENTS

GB  2 282 682  4/1995

* cited by examiner

*Primary Examiner*—John J Tabone, Jr.
(74) *Attorney, Agent, or Firm*—Lisa K. Jorgenson; Allen, Dyer, Doppelt, Milbrath & Gilchrist, P.A.

(57) ABSTRACT

The sequential access memory array is able to store p words each of n bits. Such p test words each made up of n test bits are written in the memory array, the p test words are extracted sequentially and, for each current word extracted, the n test bits that compose it are compared sequentially with n respective expected data bits before extracting the next test word.

17 Claims, 2 Drawing Sheets

METHOD OF TESTING A SEQUENTIAL ACCESS MEMORY PLANE AND A CORRESPONDING SEQUENTIAL ACCESS MEMORY SEMICONDUCTOR DEVICE

FIELD OF THE INVENTION

The invention concerns sequential access memories, in particular first in/first out (FIFO) memories, and especially testing such memories, using a dedicated test circuit integrated during fabrication of the memory and the associated test algorithm.

BACKGROUND OF THE INVENTION

At present, a test circuit integrated into a memory and an associated test algorithm, known to the person skilled in the art as a built-in self-test (BIST) algorithm, write dedicated test words into the memory array on command and then extract them and compare the test bits of the extracted words with the expected binary data bits. This necessitates the use of decoder logic which is connected to the output of the memory array and also receives the expected data, whose overall size increases as the width of the data bus of the memory increases, i.e. as the number of bits of the test words increases.

Also, in addition to this penalizing aspect of the overall surface area, this kind of decoder logic causes substantial problems with the hardware implementation ("routability") of the connections between the components of the decoder logic.

SUMMARY OF THE INVENTION

The invention aims to address the above mentioned problems. An object of the invention is to provide a sequential access memory array test that allows a particularly simple implementation leading to an extremely small overall size of the test logic.

The invention therefore provides a method of testing a sequential access memory plane adapted to store p words each of n bits. In this method p test words each made up of n test bits are written in the memory array. The p test words are extracted from the memory plane and the test bits of the extracted words are compared with expected binary data bits. According to one general feature of the invention, the p test words are extracted sequentially and, for each current word extracted, the n test bits that compose it are compared sequentially with n respective expected data bits before extracting the next test word.

In other words, unlike the conventional prior art tests, in which the n bits of an extracted test word are compared simultaneously and in parallel with an expected data word, the sequential bit-by-bit comparison of each extracted word in accordance with the invention enables the use of extremely simple comparison logic, for example including an EXCLUSIVE OR or EXCLUSIVE NOR logic gate.

In one embodiment of the method, the p test words each of n bits are written in such a way as to obtain a checkerboard test binary configuration in the memory plane. The expected data is obtained sequentially from respective logical combinations of the read addresses of the test words and the ranks of the test bits in each word that is read. This kind of embodiment makes it extremely simple to generate the expected data.

The invention further provides a sequential access semiconductor memory device including a memory array adapted to store p words each of n bits and test logic connected to the n outputs of the memory array. The test logic includes first test means for writing into the array p test words each composed of n test bits, and second test means for extracting the p test words from the memory array and compare the test bits of the extracted words with expected binary data bits.

According to one general feature of the invention, the second test means extracts the p test words sequentially and, for each current extracted word, sequentially compares the n respective test bits that compose it with n expected data bits, before extracting the next test word.

In one embodiment of the invention, the second test means include a set of n chained output registers connected to n respective outputs of the memory plane, first control means adapted to deliver a first control signal to the n output registers so as to store simultaneously in those n registers the n test bits of the current test word, second control means adapted to deliver to the n output registers a second control signal so as to shift the test bit contained in a register of the chain sequentially toward the next register and to extract sequentially from the register at the end of the chain the n test bits of the current test word, and comparator means for comparing each bit extracted from the register at the end of the chain with the corresponding expected data bit.

For example, each output register is a D-type flip-flop having a data input connected to one of the n outputs of the memory plane, a test input, a test output and a test control input for receiving successively and alternately the first control signal and the second control signal. The test output of a flip-flop is connected to the test input of the adjacent flip-flop to form the chain. The test input of the first flip-flop of the chain is adapted to receive an initial data bit (for example present at the output of another flip-flop or a register). Finally, the test output of the last flip-flop is connected to a first input of the comparator means. For example, the comparator means can include an EXCLUSIVE OR logic gate, possibly associated with an inverter so that it is an EXCLUSIVE NOR circuit.

The output registers of a sequential access memory (for example an FIFO memory) are generally already chained and connected in series with other chains of other blocks in the integrated circuit to form a test chain known to the person skilled in the art as a "scan chain". The invention is noteworthy in that it uses part of the scan chain to carry out the test in accordance with the invention (BIST test).

In one embodiment of the invention, the first test means write the p test words each of n bits in such a manner as to obtain in the memory plane a checkerboard test binary configuration. The test logic includes generator means which generates the expected data bits sequentially from respective logical combinations of the read addresses of the test words and the ranks of the test bits in each word that is read.

The generator means advantageously include first means for delivering the least significant bit of each read address, a counter for containing a binary word representative of the rank of a test bit in the current word extracted from the memory plane, second means for delivering the least significant bit of each binary word containing the counter, and an EXCLUSIVE OR or EXCLUSIVE NOR logic gate with two inputs connected to respective outputs of the first and second means and whose output delivers the expected data bits sequentially.

BRIEF DESCRIPTION OF THE DRAWINGS

Other advantages and features of the invention will become apparent on examining the following detailed description, given by way of non-limiting example, of an embodiment of the invention and the accompanying drawings, in which.

DETAILED DESCRIPTION OF THE PREFERRED EMBODIMENTS

Figure 1:
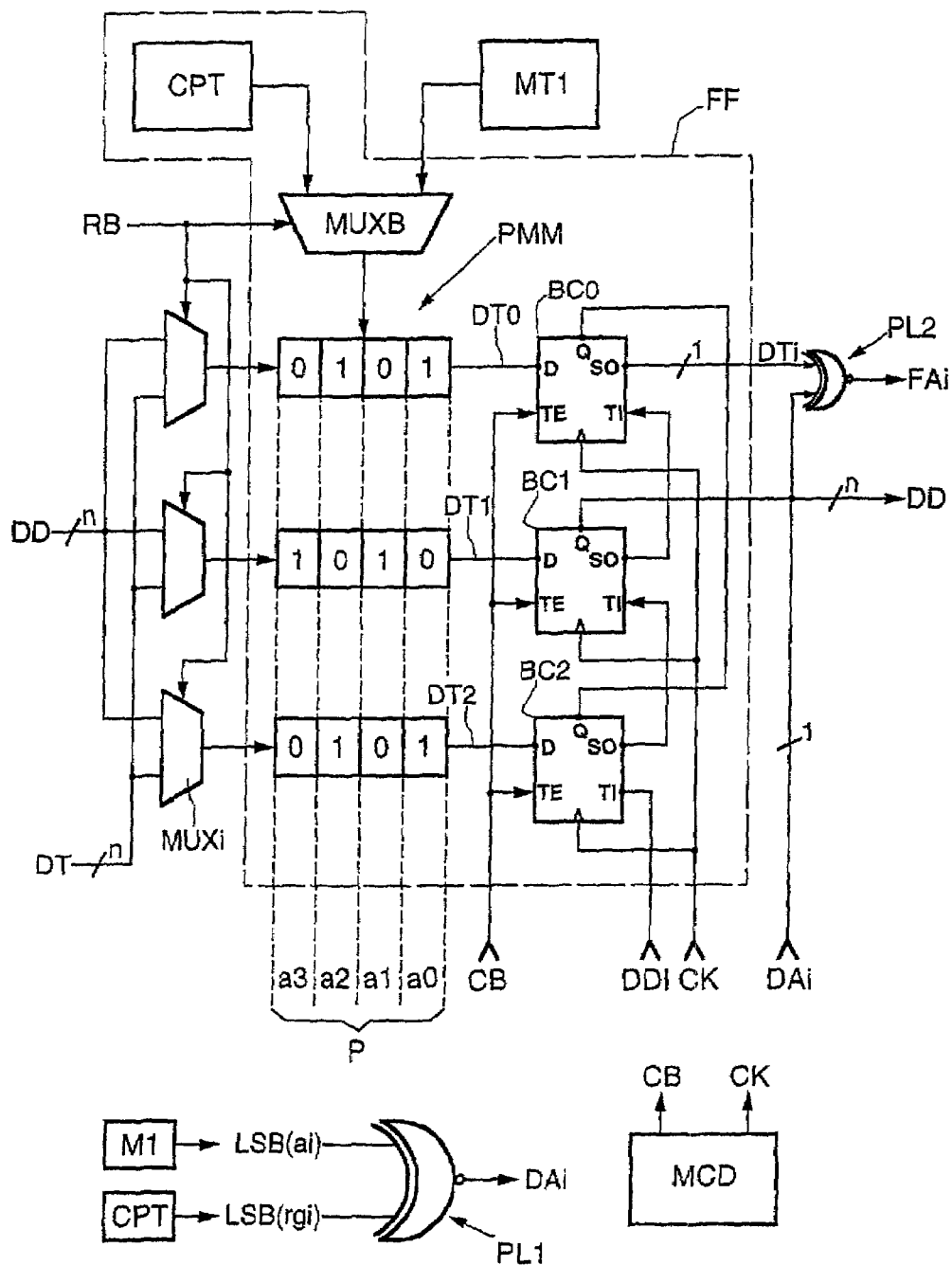
FIG. 1 is a diagram showing one embodiment of a memory device according to the invention.

FIG. 1 shows a sequential access memory device FF, for example an FIFO memory. The memory FF includes a memory array PMM able to store p words each of n bits. In other words, the depth of the memory is equal to p and the width of the data bus is equal to n. In the example described here, for simplicity, p=4 and n=3. The figure shows the successive storage addresses ai of the p words in the memory array PMM.

In the normal operating mode writing and reading are effected in the conventional manner using write and read pointers controlled in the conventional manner by control circuit/means CPT. A multiplexer MUXB controls the write and read pointers of the memory array in response to a control signal RB from either the control means CPT (in the normal mode of operation) or the test mode control circuit/means MT1 (in the test mode of operation). Similarly, the data to be written into the memory array is selected via n multiplexers MUXi which are also controlled by the control signal RB.

Accordingly, in the normal mode of operation, the n data bits DD on the bus are written into the memory array. In the test mode of operation, on the other hand, binary test data bits DT are written into the memory plane PMM.

The control means or control circuit MT1 and the multiplexers MUXi and MUXB then form first test means used, in conjunction with the test data bits DT, to write into the memory array p test words each made up of n test bits. Also, in a preferred embodiment, the first test means write the p test words of n bits in such a way as to obtain a checkerboard test configuration in the memory plane. A checkerboard configuration, as shown in FIG. 1, is one in which each test word includes alternating 0 and 1 bits, and wherein the 0 bits and the 1 bits of two words written at successive addresses are mutually shifted by one bit.

The memory FF further includes n output registers BC0-BC2. Here the output registers are D-type flip-flops each having a data input D connected to one of the n outputs of the memory plane PMM. Each flip-flop D also has a test input TI, a test output SO and a test control input TE. Furthermore, each flip-flop is clocked by a clock signal CK. Finally, each flip-flop has a data output Q.

In the normal mode of operation the n data bits extracted from the memory PMM are delivered to the respective n data inputs D of the flip-flops and then to the n data outputs Q in time with the rising edges of the clock signal CK. This is not the case in the test mode of operation, however, as explained next in more detail.

As well as being connected to n respective outputs of the memory plane PMM by their data input D, the n flip-flops are chained. To be more precise, the test output SO of one flip-flop, for example the flip-flop BC1, is connected to the test input TI of the adjacent flip-flop, here the flip-flop BC0, for example, to form a chain. The test input TI of the first flip-flop BC2 in the chain is connected to storage means containing an initial data bit DDI. The value of the initial data bit is immaterial, as explained in more detail below. The storage means can be the output of another flip-flop of another component of the integrated circuit, for example. The input TI of the first flip-flop BC2 can equally be hardwired to ground.

All the test control inputs TE receive a signal CB from the control means or control circuit MCD. When the signal CB takes the value 0, for example, it constitutes a first control signal and a data bit at the input D of a flip-flop is then delivered to the output SO on the next rising edge of the clock CK. On the other hand, when the signal CB takes the value 1, it constitutes a second control signal and, in this case, each flip-flop delivers the data bit at the test input TI to the output SO in time with the rising edges of the clock signal CK. The structure and operation of this kind of D-type flip-flop, i.e. one also having a test input, a test output and a test control input, are well known to the person skilled in the art.

Comparator means are further provided, here in the form of a EXCLUSIVE NOR logic gate PL2. A first input of the logic gate PL2 is connected to the test output SO of the flip-flip BC0 at the end of the chain. The other input of the logic gate PL2 receives the expected data bits DAi sequentially. The output of the logic gate PL2 is a logic signal that takes the value 0 or 1 in time with the comparison operations and as a function of their result.

If a checkerboard test configuration is used, there is a very simple way to generate the expected data bits DAi, as shown in the lower part of FIG. 1. To be more precise, this entails logically combining the least significant bit LSB of the read address ai of the test word that is read and the least significant bit LSB of the rank ngi of the test bit that is read in the word concerned. Specifically, if, for example, as shown in FIG. 1, the read address a0 is the binary address 00, the read address a1 is the binary address 01, the read address a2 is the binary address 10, and the read address a3 is the binary address 11, the first means or circuit M1 that deliver the least significant bit of each read address deliver the value 0 for the test word at the address a0.

A counter CT, incremented in time with the clock signal CK, counts from 0 to n−1. Assuming that the value 0 is representative of the rank of the test bit DT0, the least significant bit of the value of the counter is equal to 0 for the test bit DT0, 1 for the test bit DT1, and 0 for the test bit DT2. Logically combining the least significant bit LSB (ai) of the read address and the least significant bit LSB (rgi) of the counter value in the EXCLUSIVE NOR logic gate PL1 supplies sequentially the values 1, 0 and 1 corresponding to the test word at the address a0 in the memory plane PMM. Of course, if the test word stored at the address a0 had been 0 1 0, the logic gate PL1 would simply have been an EXCLUSIVE OR gate.

Figure 2:
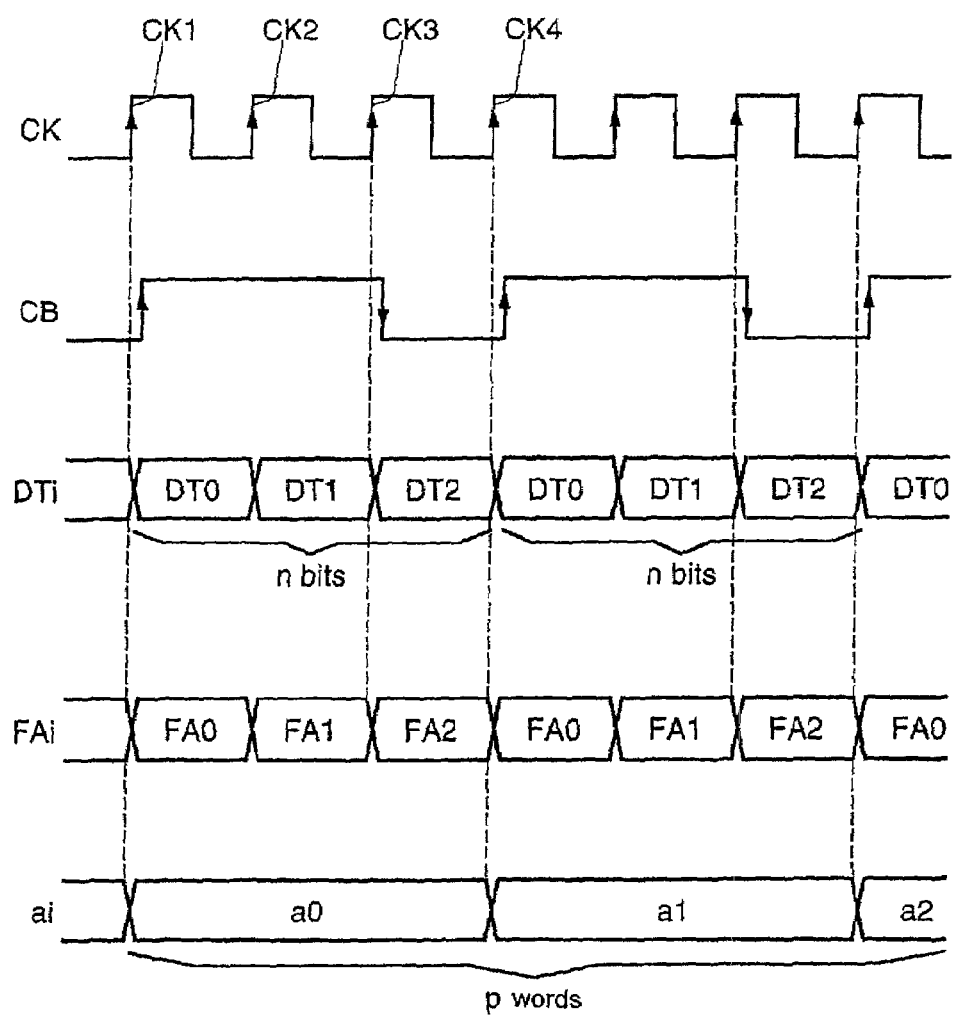
FIG. 2 is a timing diagram illustrating one embodiment of the method according to the invention.

The test on the memory plane PMM is described in more detail next with more particular reference to FIG. 2. The control means MCD that deliver the clock signal CK first assign the value 0 to the signal CB (the first control signal). Consequently, on the occurrence of the first rising edge of the clock CK1, the test data bits DT0, DT1 and DT2 of the test word stored at the address a0 are delivered simultaneously to the respective test outputs SO of the flip-flops BC0, BC1 and BC2. In the same cycle, the data bit DT0 available at the test output SO of the flip-flop BC0 is compared in the logic gate PL2 to the expected data bit DA0. The result of the comparison is indicated by the value FA0 of the signal FAi.

In the same clock signal cycle, the data bit DT2 is available at the test input TI of the flip-flop BC1 and the test data bit DT1 is available at the test input TI of the flip-flop BC0. The control means MCD change the state of the signal CB (the second control signal) to 1 after the rising edge CK1 of the clock signal, and before the next rising edge CK2. Accordingly, on the next rising edge CK2 of the clock CK, the data bits available at the test outputs SO of the flip-flops are shifted toward the flip-flop at the end of the chain.

To be more precise, the initial data bit DDI is then available at the output SO of the flip-flop BC2, the test data bit DT2 is available at the test output SO of the flip-flop BC1 and the test data bit DT1 is available at the test output SO of the flip-flop BC0 and can then be tested by comparing it in the logic gate PL2 with the corresponding expected data bit DA1. The signal CB is still at 1 on the next rising edge CK3 of the clock. Thus at this time the data bit DT2 is available at the test output SO of the flip-flop BC0 and can be compared in the logic gate PL2 with the expected data bit DA2.

At this time, the whole of the test word stored in the memory plane PMM at the read address a0 has been tested. To test the next test word, stored at the read address a1 and now available at the output of the memory plane PMM, the control means MCD change the value of the signal CB to 0. The result is that on the next rising edge CK4 of the clock signal, the test bits DT2, DT1 and DT0 of the next test word are available at the test outputs SO of the flip-flops BC2, BC1 and BC0.

Then, after this rising edge CK4 of the clock signal, the signal CB is again set to logic 1 and the process of shifting and sequentially testing the test bits of the test word is effected in a similar manner to that just described for the preceding test word. It should therefore be noted here that the initial data bit DDI is never involved in the test and consequently its value is immaterial.

The invention therefore provides a very simple memory plane test which is carried out at the normal operating frequency of the circuit and uses extremely simple and compact test logic.

The invention is not limited to the embodiments and uses that have just been described, but embraces all variants thereof. For example, the test according to the invention could easily be applied to a last in/first out (LIFO) sequential access memory.

That which is claimed is:

1. A method of testing a sequential access memory array for storing p words each of n bits, the method comprising:
   writing p test words each made up of n test bits in the memory array in such a way as to obtain a checkerboard test binary configuration in the memory array;
   sequentially extracting the p test words from the memory array;
   comparing the test bits of the extracted test words with expected data bits so that for each test word extracted, the corresponding n test bits are compared sequentially with n respective expected data bits before extracting the next test word; and
   sequentially obtaining the expected data bits by respectively logically combining read addresses of the test words and ranks of the test bits of each test word that is read.

2. A method of testing a sequential access memory array, the method comprising:
   writing test words each made up of a plurality of test bits to form a checkerboard test binary configuration in the memory array;
   sequentially extracting the test words from the memory array;
   comparing the test bits of the extracted test words with expected data bits so that for each test word extracted, the corresponding test bits are compared sequentially with respective expected data bits before extracting the next test word; and
   sequentially obtaining the expected data bits by respectively logically combining read addresses of the test words and ranks of the test bits of each test word that is read.

3. A sequential access semiconductor memory device comprising:
   a memory array for storing p words each of n bits; and
   test logic connected to n outputs of the memory array and including
   first test means for writing p test words each having n test bits to obtain a checkerboard test binary configuration in the memory array,
   second test means for sequentially extracting the p test words from the memory array and, for each extracted test word, sequentially comparing the corresponding n test bits with n expected data bits, before extracting the next test word, and
   generator means for sequentially generating the expected data bits from respective logical combinations of read addresses of the test words and ranks of the test bits of each test word that is read.

4. The device according to claim 3, wherein the second test means comprises:
   a set of n connected output registers connected to n respective outputs of the memory array;
   first control means for delivering a first control signal to the output registers to simultaneously store the n test bits of a current test word in the output registers;
   second control means for delivering a second control signal to the output registers to sequentially shift the test bit contained in each connected output register toward the next connected output register and to sequentially extract the test bits of the current test word from a last connected output register of the set; and
   comparator means for comparing each bit extracted from the last connected output register with the corresponding expected data bit.

5. The device according to claim 4, wherein each output register comprises a D-type flip-flop having a data input connected to one of the n outputs of the memory array, a test input, a test output and a test control input for receiving successively and alternately the first control signal and the second control signal; the test output of each flip-flop being connected to the test input of an adjacent flip-flop, the test input of a first flip-flop of the set being receiving an initial data bit, and the test output of the last flip-flop of the set being connected to a first input of the comparator means.

6. The device according to claim 5, wherein the comparator means comprises one of an EXCLUSIVE OR and EXCLUSIVE NOR logic gate.

7. The device according to claim 3, wherein the generator means comprises;
   first delivery means for generating a least significant bit of each read address;
   a counter for storing a binary word representative of the rank of a test bit in the current test word extracted from the memory array;
   second delivery means for generating a least significant bit of each binary word in the counter; and
   one of an EXCLUSIVE OR and EXCLUSIVE NOR logic gate comprising two inputs connected to respective outputs of the first and second delivery means, and an output sequentially delivering the expected data bits.

8. A sequential access semiconductor memory device comprising:
   a memory array; and
   test logic connected to the memory array and including
   a first test circuit for writing test words each having a plurality of test bits to obtain a checkerboard test binary configuration in the array, a second test circuit for sequentially extracting the test words from the memory array and, for each extracted test word, sequentially comparing the corresponding test bits with expected data bits, before extracting the next test word, and an expected bit generator for sequentially generating the expected data bits from respective logical combinations of read addresses of the test words and ranks of the test bits of each test word that is read.

9. The device according to claim 8, wherein the second test circuit comprises:

a set of connected output registers connected to respective outputs of the memory array;

a first control device for delivering a first control signal to the output registers to simultaneously store the test bits of a current test word in the output registers;

a second control device for delivering a second control signal to the output registers to sequentially shift the test bit contained in each connected output register toward the next connected output register and to sequentially extract the test bits of the current test word from a last connected output register of the set; and a comparator for comparing each bit extracted from the last connected output register with the corresponding expected data bit.

10. The device according to claim 9, wherein each output register comprises a D-type flip-flop having a data input connected to one of the outputs of the memory array, a test input, a test output and a test control input for receiving successively and alternately the first control signal and the second control signal; the test output of the flip-flops being connected to the test input of an adjacent flip-flop, the test input of a first flip-flop of the set receiving an initial data bit, and the test output of the last flip-flop of the set being connected to a first input of the comparator.

11. The device according to claim 10, wherein the comparator comprises one of an EXCLUSIVE OR and EXCLUSIVE NOR logic gate.

12. The device according to claim 8, wherein the generator comprises:

a first bit generator for generating a least significant bit of each read address;

a counter for storing a binary word representative of the rank of a test bit in the current test word extracted from the memory array;

a second bit generator for generating a least significant bit of each binary word in the counter; and a logic gate comprising two inputs connected to respective outputs of the first and second delivery circuits, and an output sequentially delivering the expected data bits.

13. A test circuit for a sequential access semiconductor memory device having a memory array, the test circuit comprising:

a first test circuit for writing test words each having a plurality of test bits to obtain a checkerboard test binary configuration in the array;

a second test circuit for sequentially extracting the test words from the memory array and, for each extracted test word, sequentially comparing the corresponding test bits with expected data bits, before extracting the next test word; and an expected bit generator for sequentially generating the expected data bits from respective logical combinations of read addresses of the test words and ranks of the test bits of each test word that is read.

14. The circuit according to claim 13, wherein the second test circuit comprises:

a set of connected output registers connected to respective outputs of the memory array;

a first control device for delivering a first control signal to the output registers to simultaneously store the test bits of a current test word in the output registers;

a second control device for delivering a second control signal to the output registers to sequentially shift the test bit contained in each connected output register toward the next connected output register and to sequentially extract the test bits of the current test word from a last connected output register of the set; and a comparator for comparing each bit extracted from the last connected output register with the corresponding expected data bit.

15. The circuit according to claim 14, wherein each output register comprises a D-type flip-flop having a data input connected to one of the outputs of the memory array, a test input, a test output and a test control input for receiving successively and alternately the first control signal and the second control signal; the test output of the flip-flops being connected to the test input of an adjacent flip-flop, the test input of a first flip-flop of the set receiving an initial data bit, and the test output of the last flip-flop of the set being connected to a first input of the comparator.

16. The circuit according to claim 15, wherein the comparator comprises one of an EXCLUSIVE OR and EXCLUSIVE NOR logic gate.

17. The circuit according to claim 13, wherein the generator comprises:

a first bit generator for generating a least significant bit of each read address;

a counter for storing a binary word representative of the rank of a test bit in the current test word extracted from the memory array;

a second bit generator for generating a least significant bit of each binary word in the counter; and a logic gate comprising two inputs connected to respective outputs of the first and second delivery circuits, and an output sequentially delivering the expected data bits.

* * * * *

UNITED STATES PATENT AND TRADEMARK OFFICE
CERTIFICATE OF CORRECTION

PATENT NO. : 7,661,040 B2  Page 1 of 1
APPLICATION NO. : 10/075113
DATED : February 9, 2010
INVENTOR(S) : Beaujoin et al.

It is certified that error appears in the above-identified patent and that said Letters Patent is hereby corrected as shown below:

Column 6, Line 42        Delete: "being"

Signed and Sealed this

Twenty-fourth Day of August, 2010

David J. Kappos
*Director of the United States Patent and Trademark Office*

UNITED STATES PATENT AND TRADEMARK OFFICE
CERTIFICATE OF CORRECTION

PATENT NO. : 7,661,040 B2 Page 1 of 1
APPLICATION NO. : 10/075113
DATED : February 9, 2010
INVENTOR(S) : Beaujoin et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1065 days.

Signed and Sealed this

Twenty-eighth Day of December, 2010

David J. Kappos
*Director of the United States Patent and Trademark Office*